(12) United States Patent
Matsuzawa

(10) Patent No.: US 10,714,518 B2
(45) Date of Patent: Jul. 14, 2020

(54) IMAGING DEVICE

(71) Applicant: SHINKO ELECTRIC INDUSTRIES CO., LTD., Nagano-shi, Nagano (JP)

(72) Inventor: Satoshi Matsuzawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/218,702

(22) Filed: Dec. 13, 2018

(65) Prior Publication Data
US 2019/0189659 A1 Jun. 20, 2019

(30) Foreign Application Priority Data

Dec. 18, 2017 (JP) .................. 2017-241961

(51) Int. Cl.
*H01L 27/14* (2006.01)
*H01L 27/146* (2006.01)

(52) U.S. Cl.
CPC .. *H01L 27/14618* (2013.01); *H01L 27/14636* (2013.01); *H01L 27/14683* (2013.01)

(58) Field of Classification Search
CPC ... H01L 27/14; H01L 27/146; H01L 27/1461; H01L 27/14618; H01L 27/1463; H01L 27/14636; H01L 27/1468; H01L 27/14683
USPC ................................. 257/733, 433
See application file for complete search history.

(56) References Cited

U.S. PATENT DOCUMENTS

| | | | |
|---|---|---|---|
| 2005/0059269 A1 | 3/2005 | Kim et al. | |
| 2006/0192230 A1* | 8/2006 | Wood ............... | H01L 27/14618 257/234 |

FOREIGN PATENT DOCUMENTS

| | | |
|---|---|---|
| JP | 62-092661 | 6/1987 |
| JP | 2001-108878 | 4/2001 |
| JP | 2004-289572 | 10/2004 |
| JP | 2005-005614 | 1/2005 |
| JP | 2005-093433 | 4/2005 |
| JP | 2006-128755 | 5/2006 |

* cited by examiner

*Primary Examiner* — Monica D Harrison
(74) *Attorney, Agent, or Firm* — Rankin, Hill & Clark LLP

(57) ABSTRACT

An imaging device includes: a container including a bottom plate and a side wall provided on an outer circumferential portion of the bottom plate; a step portion which is formed in a top outer circumferential portion of the side wall and includes: a horizontal surface that is located at a lower position than a top surface of the side wall; and a side surface that connects the top surface of the side wall to the horizontal surface; an imaging element mounted on the bottom plate; a glass lid which is bonded to the top surface of the side wall with a first adhesive layer; and a cover frame which is disposed on the step portion and bonded to the side surface of the step portion and an outer circumferential surface of the glass lid with a second adhesive layer.

9 Claims, 12 Drawing Sheets

IMAGING DEVICE

This application claims priority from Japanese Patent Application No. 2017-241961 filed on Dec. 18, 2017, the entire contents of which are herein incorporated by reference.

BACKGROUND

1. Technical Field

The present disclosure relates to an imaging device.

2. Background Art

Solid-state imaging devices are known that are equipped with a solid-state imaging element such as a CMOS image sensor. In such solid-state imaging devices, the solid-state imaging element is mounted in a container that is formed with a recess on the top surface side and a glass lid is bonded to the top surface of the container (see JP-U-62-92661; JP-A-2001-108878; JP-A-2004-289572; JP-A-2005-5614; JP-A-2005-93433; and JP-A-2006-128755, for example).

As described later as part of preparatory items, a solid-state imaging device is connected to a mounting board by reflow-heated solder. At this time, since the air inside the solid-state imaging device expands, the glass lid may peel off the container if the strength of the bonding between the container and the glass lid is weak.

SUMMARY

Certain embodiments provide an imaging device.

The imaging device comprises:

a container comprising a bottom plate and a side wall provided on an outer circumferential portion of the bottom plate;

a step portion which is formed in a top outer circumferential portion of the side wall and comprises: a horizontal surface that is located at a lower position than a top surface of the side wall; and a side surface that connects the top surface of the side wall to the horizontal surface;

an imaging element mounted on the bottom plate;

a glass lid which is bonded to the top surface of the side wall with a first adhesive layer; and a cover frame which is disposed on the step portion and bonded to the side surface of the step portion and an outer circumferential surface of the glass lid with a second adhesive layer.

DETAILED DESCRIPTION

Embodiments of the present invention will be hereinafter described with reference to the accompanying drawings.

Before the description of the embodiments, preparatory items will be described as a base of the embodiments.

FIGS. 1A and 1B to FIG. 3 are views for description of problems of a solid-state imaging device relating to the preparatory items. The preparatory items are items that are based on personal studies of the inventor and include techniques that are not known in the art.

Figure 1A:
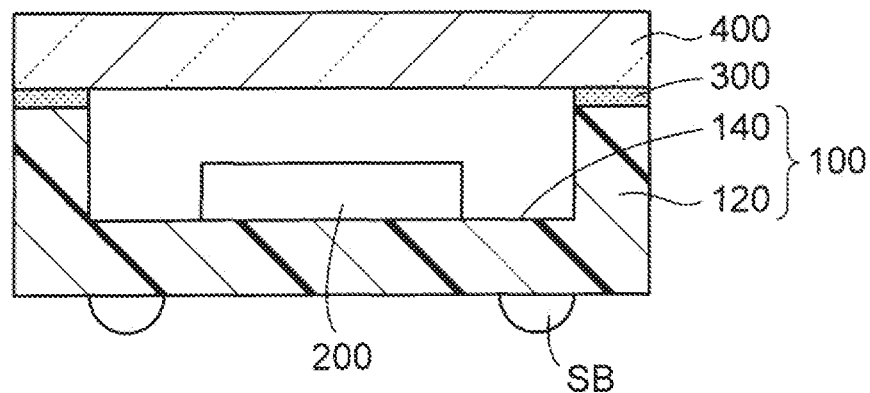
FIGS. 1A and 1B are sectional views (Part 1) of a solid-state imaging device relating to preparatory items.

As shown in FIG. 1A, the solid-state imaging device (an example of an imaging device) relating to the preparatory items is equipped with a container 100 having a recess 140 formed on its top surface side and a side wall 120 provided on its outer circumferential portion. A solid-state imaging element 200 is mounted on the bottom surface of the recess 140 of the container 100.

The solid-state imaging element 200 is connected to electrodes (not shown) formed on the container 100 by metal wires (not shown) and thereby electrically connected to solder bumps SB formed on the bottom surface of the container 100.

Furthermore, a glass lid 400 is bonded to the top surface of the side wall 120 of the container with an adhesive layer 300, whereby the solid-state imaging element 200 which is mounted in the container 100 is sealed in airtightly.

Figure 1B:
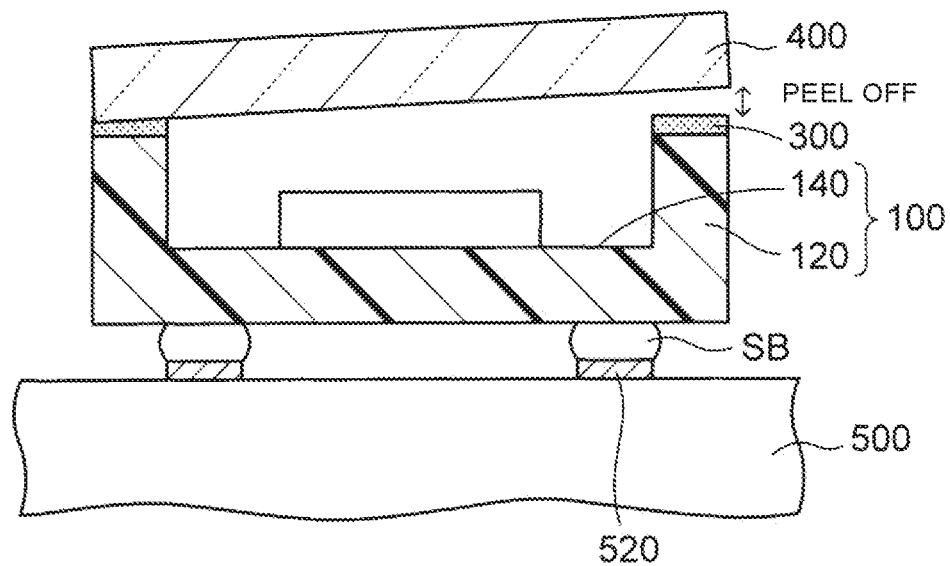

FIG. 1B shows how the solid-state imaging device shown in FIG. 1A is connected to a mounting board 500 such as a mother board. As shown in FIG. 1B, the solder bumps SB of the solid-state imaging device shown in FIG. 1A are connected to respective connection electrodes 520 of the mounting board 500 by placing the solder bumps SB on the connection electrodes 520 and subjecting the solder bumps SB to reflow heating. The reflow heating is performed at about 260° C., for example.

The air inside the solid-state imaging device expands during the reflow heating. Thus, the glass lid 400 may peel off the container 100 if the strength of the bonding with the adhesive layer 300 between the side wall 120 of the container 100 and the glass lid 400 is weak.

Figure 2:
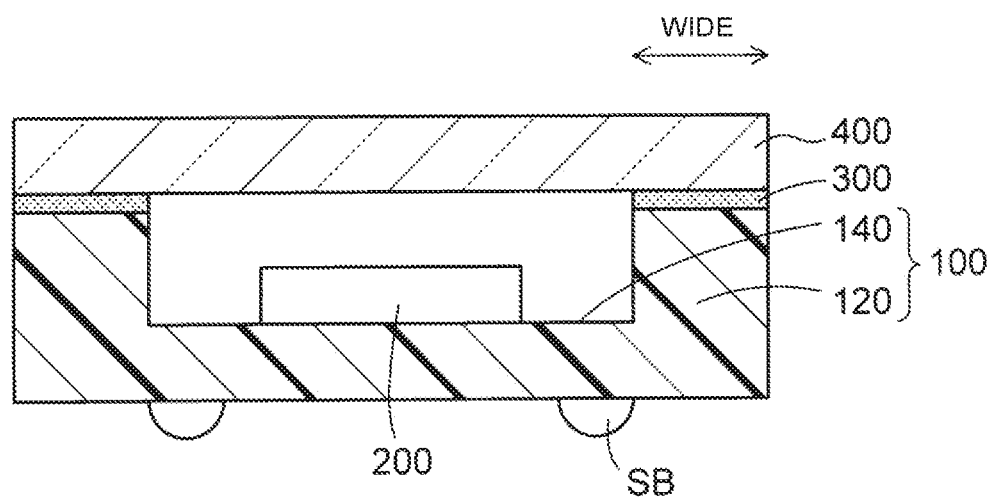
FIG. 2 is a sectional view (Part 2) of the solid-state imaging device relating to the preparatory items.

One measure against this problem would be a structure shown in FIG. 2 in which the bonding strength is increased by increasing the bonding area by widening the side wall 120 of the container 100.

However, in this structure, the solid-state imaging device is increased in size. This structure cannot accommodate miniaturization because of a restriction relating to the outer size. Furthermore, size increase of the solid-state imaging device results in increase in material costs of the container 100, the adhesive layer 300, and the glass lid 400. Still further, the risk of occurrence of a warp increase as the solid-state imaging device becomes larger.

Figure 3:
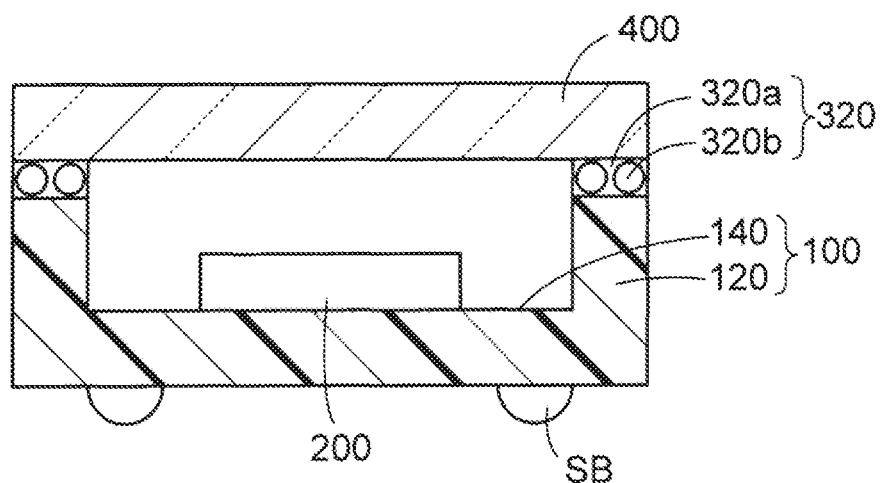
FIG. 3 is a sectional view (Part 3) of the solid-state imaging device relating to the preparatory items.

Another measure would be a technique that uses a beads-containing adhesive layer 320 (see FIG. 3). The beads-containing adhesive layer 320 contains, in an adhesive resin 320a, beads 320b made of silicon, a glass filler, or the like. Where the beads-containing adhesive layer 320 is used, its thickness becomes approximately equal to the diameter of the beads 320b contained therein. The thickness of the beads 320b is 20 to 30 μm, and the beads-containing adhesive layer 320 can be made thicker than the adhesive layer 300 without beads.

Being thick, the beads-containing adhesive layer 320 exhibits proper buffering performance and flexibility and hence is less prone to deform during reflow heating. Thus, the beads-containing adhesive layer 320 can resist expansion of the air inside the container 100 during reflow heating, whereby peeling of the glass lid 400 can be prevented.

However, to use the beads-containing adhesive layer 320, it is necessary to manage the bead size strictly, which causes cost increase. Furthermore, where the top surface of the side wall 120 of the container 100 is as narrow as about 0.5 mm, it is necessary to apply paste-like beads-containing adhesive using a dispenser whose nozzle is so narrow as to be suitable for the narrow top surface of the side wall 120.

Where the nozzle of the dispenser is narrow, the nozzle is prone to be clogged by a lump of a collection of plural beads, which obstructs the dispensing work and lowers the production efficiency.

Furthermore, in the beads-containing adhesive layer 320, since the adhesive resin 320a and the beads 320b are different in thermal linear expansion coefficient, cracks tend to occur at the interfaces between the adhesive resin 320a and the beads 320b.

Still further, in the beads-containing adhesive layer 320, since many beads 320b used have a variation in diameter, the allowances of the length from the solid-state imaging element 200 to the back surface of the glass lid 400 and the inclination of the glass lid 400 are set large.

The above problems can be solved by solid-state imaging devices and manufacturing methods thereof according to the embodiments described below.

(First Embodiment)

Figure 9:
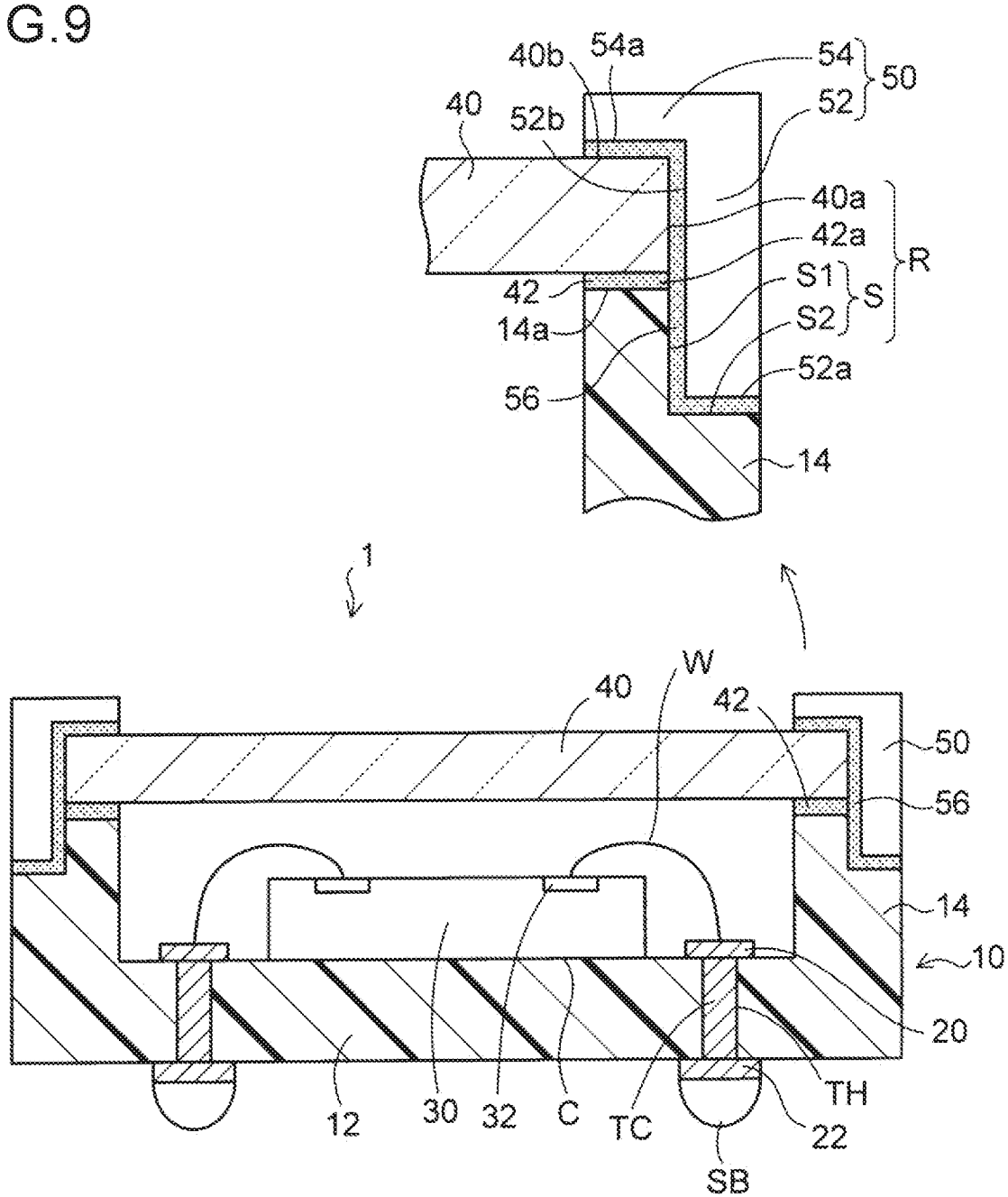
FIG. 9 is a sectional view of the solid-state imaging device according to the first embodiment.
Figure 10:
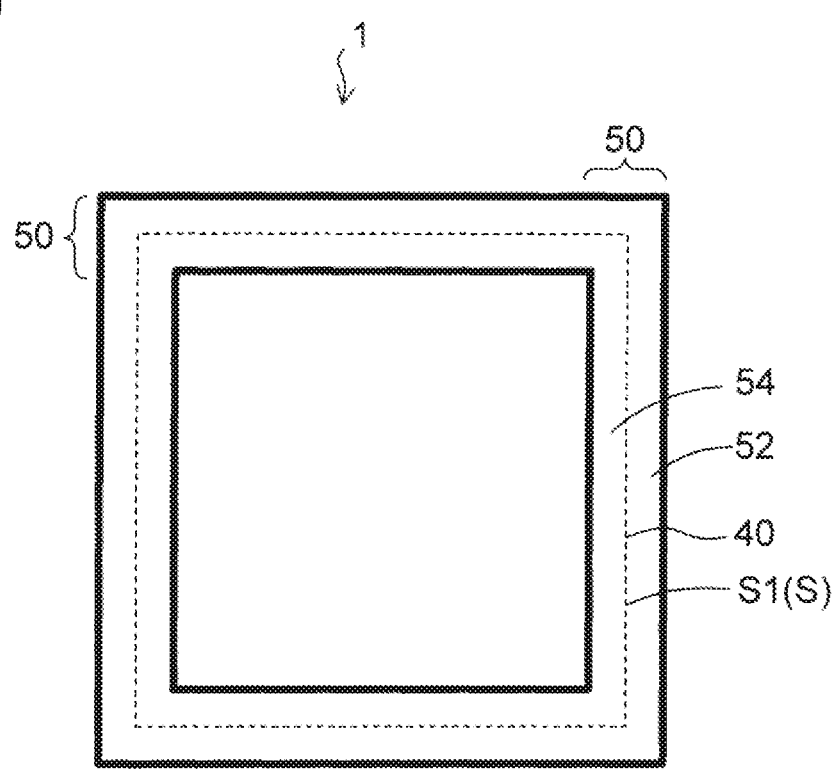
FIG. 10 is a plan view of the solid-state imaging device according to the first embodiment.

FIGS. 4A and 4B to FIGS. 8A and 8B are views for description of a manufacturing method of a solid-state imaging device according to a first embodiment. FIGS. 9 and 10 are views for description of a solid-state imaging device according to the first embodiment. The configuration of the solid-state imaging device according to the first embodiment will be described below together with its manufacturing method.

Figure 4A:
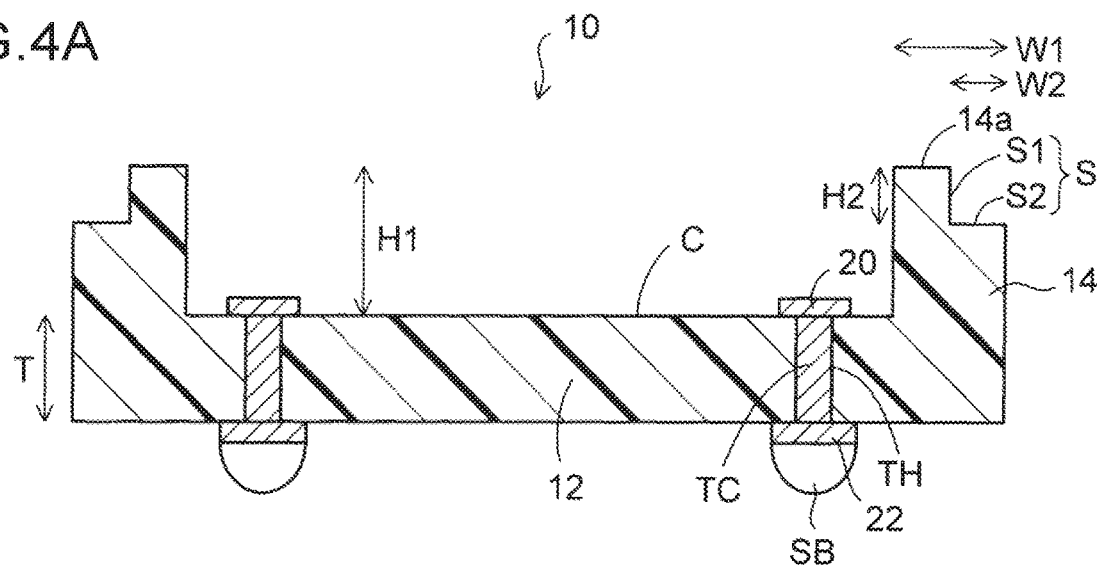
FIG. 4A is a sectional view (Part 1) for description of a manufacturing method of a solid-state imaging device according to a first embodiment of the present invention.

In the manufacturing method of a solid-state imaging device according to the first embodiment, first, as shown in FIG. 4A, a container 10 for housing a solid-state imaging device is prepared. A preferable example of the container 10 is made of ceramic such as aluminum oxide. Alternatively, the container 10 may be made of such an insulative material as an insulative resin.

The container 10 includes a bottom plate 12 and a frame-shaped side wall 14 which is provided on an outer circumferential portion of the bottom plate 12. A recess C is formed by the bottom plate 12 and the side wall 14.

Figure 4B:
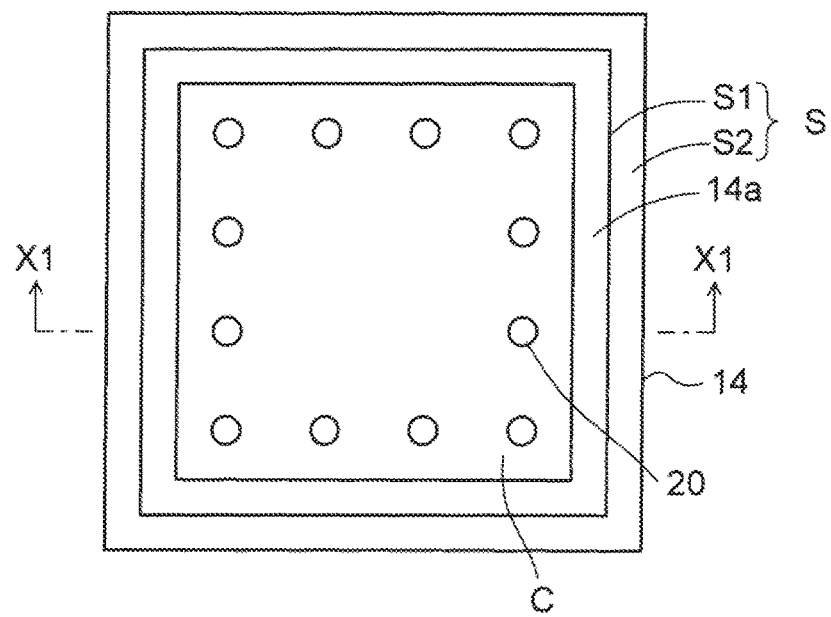
FIG. 4B is a plan view (Part 1) for description of the manufacturing method of the solid-state imaging device according to the first embodiment.

FIG. 4B is a reduced plan view, as viewed from above, of FIG. 4A. FIG. 4A is a sectional view taken along line X1-X1 in FIG. 4B.

As shown in 4A, a top outer circumferential portion of the side wall 14 of the container 10 is formed with a step portion S. In FIG. 4B which is a reduced plan view, the step portion S of the side wall 14 is shaped like a square frame.

The step portion S of the side wall 14 is formed by a side surface S1 which extends down vertically from the outer circumference of a top surface 14a of the side wall 14 and a horizontal surface S2 which extends outward horizontally from the bottom ends of the side surfaces S1. That is, the step portion S has the horizontal surface S2 which is located at a lower position than the top surface 14a of the side wall 14 and the side surface S1 which connects the top surface 14a and the horizontal surface S2.

For example, the thickness T of the bottom plate 12 of the container 10 is about 1 mm and the height H1 of the recess C is about 0.8 mm. The width W1 of the side wall 14 of the container 10 is 0.5 to 4.0 mm. The height H2 of the step portion S of the side wall 14 is about 100 μm, and the width W2 of the step portion S is set approximately equal to half of the width W1 of the side wall 14.

As described above, the top outer circumferential portion of the side wall 14 of the container 10 is formed with the ring-shaped step portion S.

As shown in FIG. 4A, first electrodes 20 are formed on the top surface of the bottom plate 12 of the container 10 and second electrodes 22 are formed on the bottom surface of the bottom plate 12. Through-holes TH penetrate through the bottom plate 12 of the container 10 in its thickness direction and are filled with respective penetration conductors TC.

Each first electrode 20 and the corresponding second electrode 22 are connected to each other by the corresponding penetration conductor TC. In the example shown in FIG. 4B, the first electrodes 20 are island-like pads and area arranged alongside the outer circumference of the bottom surface of the recess C of the container 10.

The first electrodes 20, the second electrodes 22, and the penetration conductors TC are made of copper, for example, and formed by photolithography and electrolytic plating, for example.

Solder bumps SB are formed on the respective second electrodes 22 which are formed on the bottom surface of the container 10. The solder bumps SB are example external connection terminals and may be bump electrodes made of any of various metals such as copper (Cu) and gold (Au).

Figure 5A:
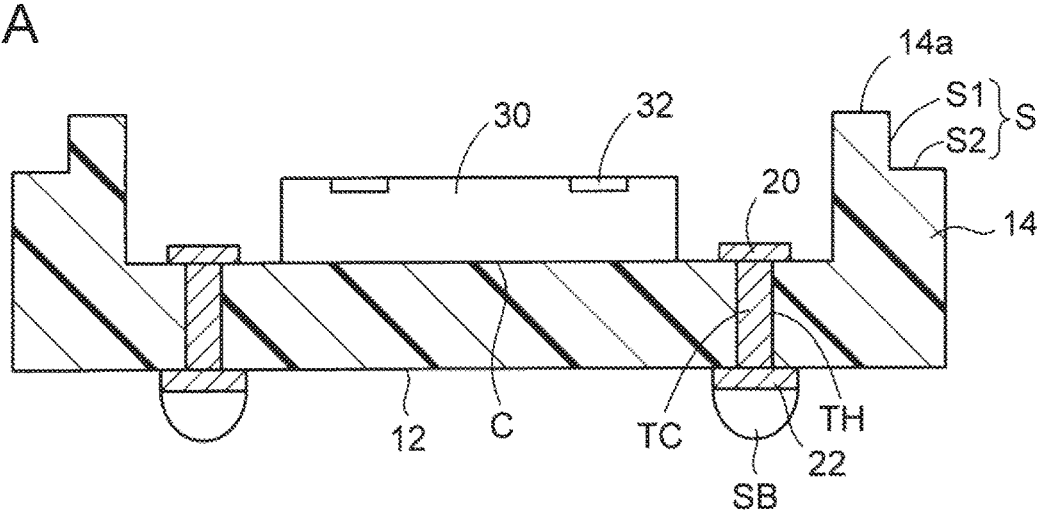
FIG. 5A is a sectional view (Part 2) for description of the manufacturing method of the solid-state imaging device according to the first embodiment.

Subsequently, a solid-state imaging element 30 (am example of an imaging element) is prepared as shown in FIG. 5A. The solid-state imaging element 30 is a CMOS image sensor, a CCD image sensor, or the like. The solid-state imaging element 30 has a photodetector (not shown) at the center of its top surface and connection terminals 32 at peripheral positions.

Pixels for converting light coming from a subject into electrical signals are arranged in matrix form in the photodetecting portion of the solid-state imaging element 30. An image is reproduced by recombining signals that are output from the respective pixels.

The solid-state imaging element 30 is mounted on the bottom plate 12 of the container 10 by bonding the former to the latter with an adhesive (not shown) with its photodetector up.

Figure 5B:
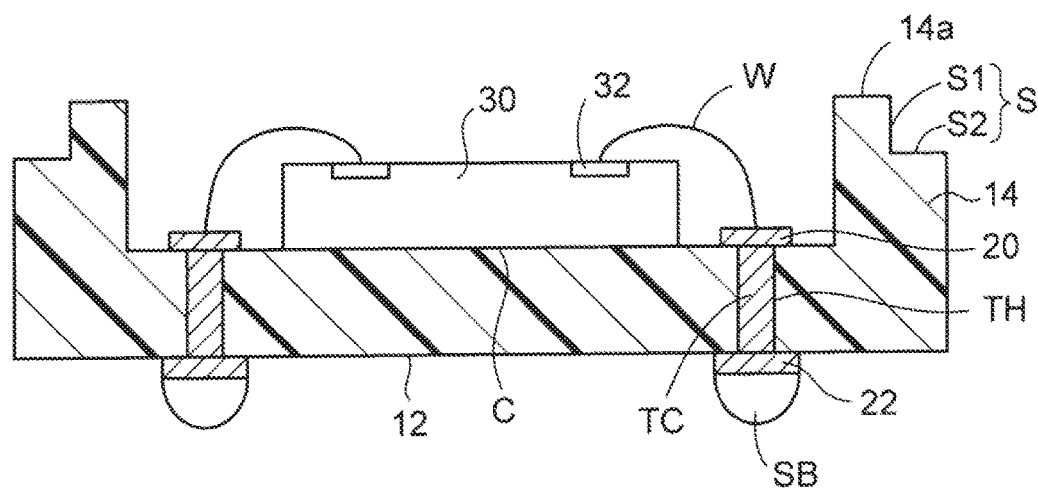
FIG. 5B is a top view (Part 2) for description of the manufacturing method of the solid-state imaging device according to the first embodiment.

Then, as shown in FIG. 5B, the connection terminals 32 of the solid-state imaging element 30 are connected to the first electrodes 20 of the container 10 by metal wires W, respectively, by a wire bonding method.

Figure 6:
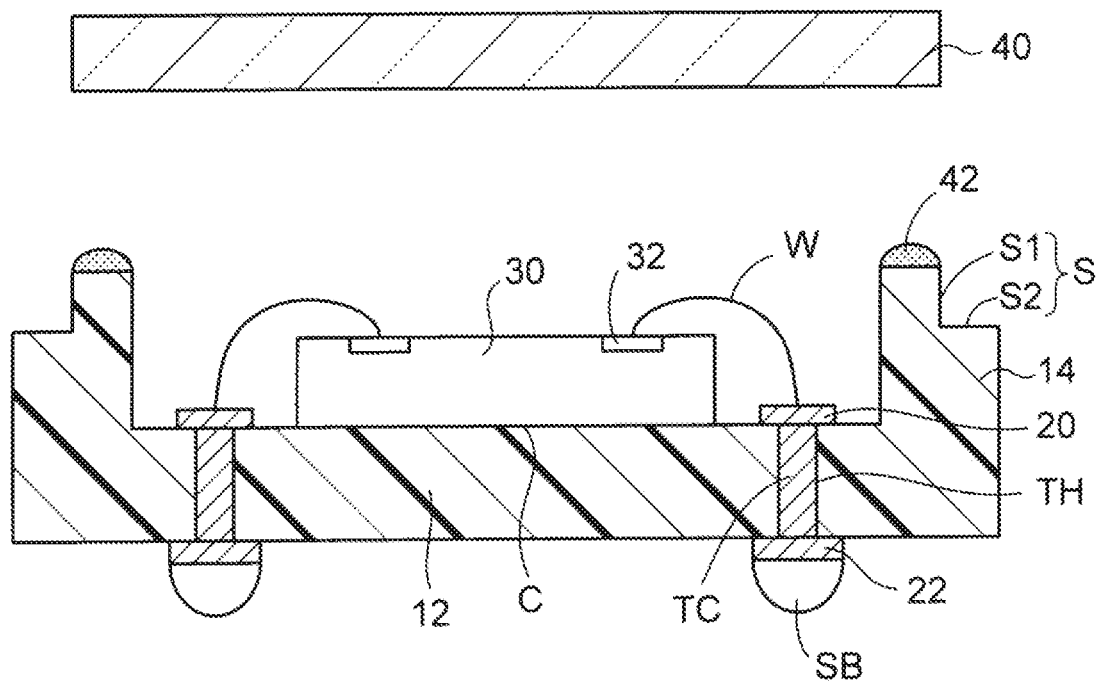
FIG. 6 is a sectional view (Part 3) for description of the manufacturing method of a solid-state imaging device according to the first embodiment.

Then, as shown in FIG. 6, a transparent glass lid 40 is prepared. The glass lid 40 has a plan-view shape and size that are suitable for the square that is defined in a plan view by the outer circumference of the side surfaces S1 of the step portion S of the side wall 14 of the container 10.

Subsequently, a first adhesive layer 42 is applied to the top surface 14a of the side wall 14 of the container 10 from the nozzle of a dispenser (not shown). A preferable example of the first adhesive layer 42 is one made of an ultraviolet-setting and thermosetting adhesive material that is cured by each of illumination with ultraviolet light and heat treatment.

Figure 7A:
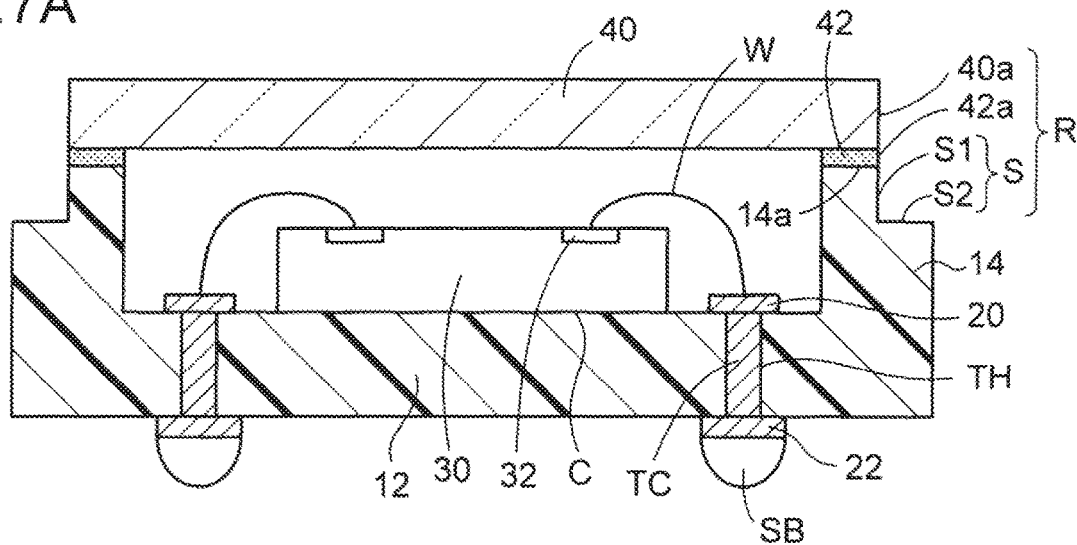
FIG. 7A is a sectional view (Part 4) for description of the manufacturing method of the solid-state imaging device according to the first embodiment.

Then, as shown in FIG. 7A, the glass lid 40 is placed on the first adhesive layer 42 that is formed on the top surface 14a of the side wall 14 of the container 10. Then the first adhesive layer 42 is illuminated with ultraviolet light through the transparent glass lid 40, whereby the first adhesive layer 42 is semi-cured and fixed tentatively.

Subsequently, after the glass lid 40 is positioned if necessary, the first adhesive layer 42, including its portion that ultraviolet light did not reach, is cured completely by heat treatment at about 180° C. As a result, the glass lid 40 is fixed to the top surface 14a of the side wall 14 of the container 10 with high positional accuracy. The thickness of the first adhesive layer 42 is about 10 μm, for example.

Figure 7B:
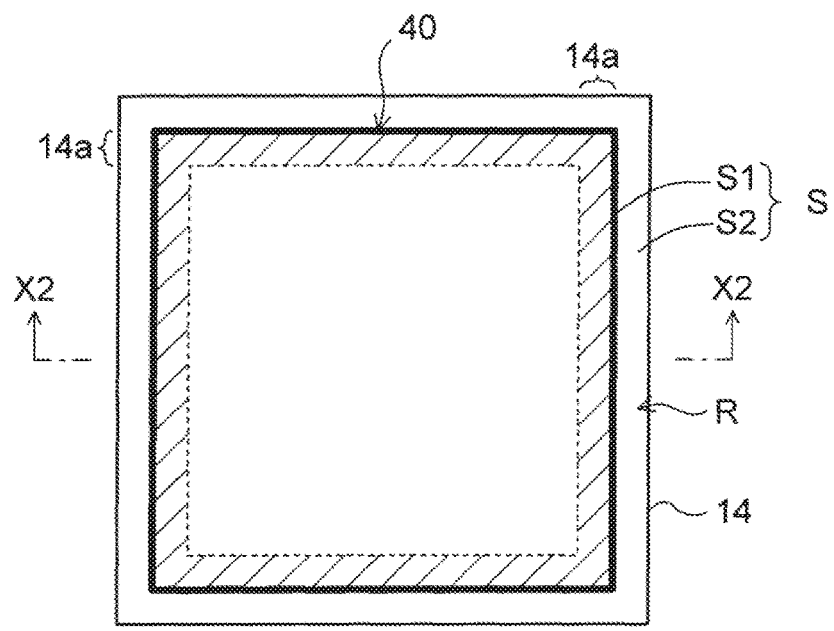
FIG. 7B is a top view (Part 4) for description of the manufacturing method of the solid-state imaging device according to the first embodiment.

FIG. 7B is a reduced plan view, as viewed from above, of the structural body shown in FIG. 7A. FIG. 7A is a sectional view taken along line X2-X2 in FIG. 7B.

In FIG. 7B, the top surface 14a of the side wall 14 of the container 10 is hatched and the glass lid 40 is drawn by a thick line.

As shown in FIG. 7B which is a plan view, the top surface 14a of the side wall 14 of the container 10 is shaped like a square frame. A peripheral portion of the square glass lid 40 is bonded to the top surface 14a of the side wall 14 of the container 10 with the first adhesive layer 42 (see FIG. 7A).

The step portion S of the side wall 14 of the container 10 is exposed from the glass lid 40. As shown in FIG. 7A, side surfaces 42a of the first adhesive layer 42 and outer circumferential surfaces 40a of the glass lid 40 are located over the side surfaces S1 of the step portion S of the side wall 14 of the container 10, whereby an L-shaped outer circumferential step R is formed. Corresponding ones of the side surfaces S1 of the step portion S of the side wall 14 of the container 10, the side surfaces 42a of the first adhesive layer 42, and the outer circumferential surfaces 40a of the glass lid 40 are approximately flush with each other and form an approximately flat vertical surface.

As described later, the L-shaped outer circumferential step R of the structural body shown in FIG. 7A functions as a bonding reinforcement region for reinforcing the bonding strength of the glass lid 40.

Figure 8A:
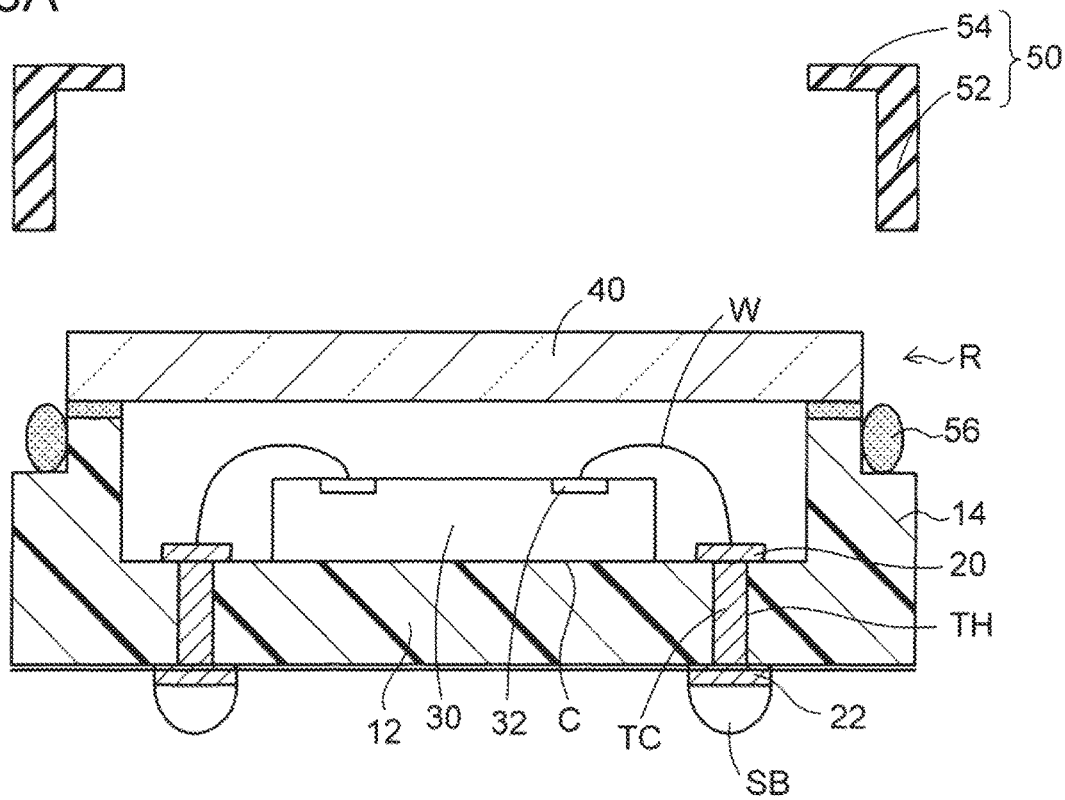
FIG. 8A is a sectional view (Part 5) for description of the manufacturing method of the solid-state imaging device according to the first embodiment.
Figure 8B:
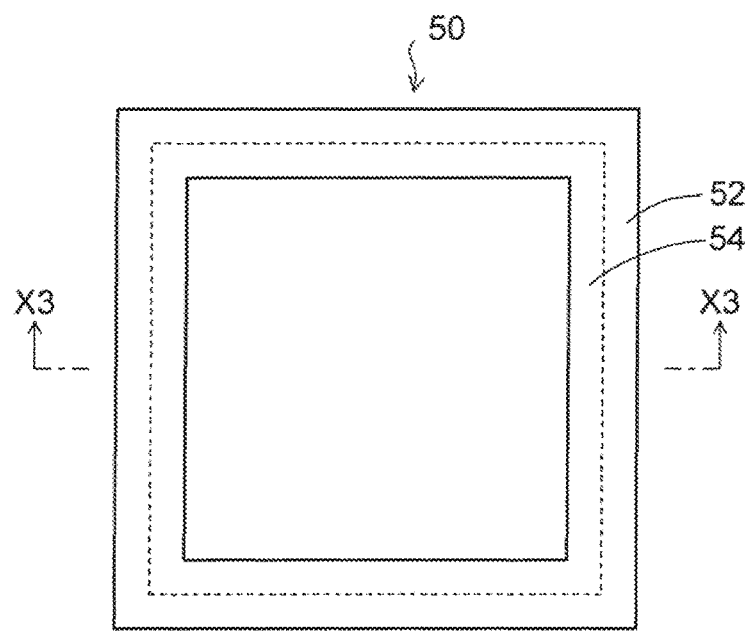
FIG. 8B is a top view (Part 5) for description of the manufacturing method of the solid-state imaging device according to the first embodiment.

Then, a cover frame 50 is prepared as shown in FIG. 8A. FIG. 8B is a reduced plan view, as viewed from above, of the cover frame 50 shown in FIG. 8A. The cross section of the cover frame 50 in FIG. 8A is a sectional view taken along line X3-X3 in FIG. 8B.

As shown in FIG. 8A, the cover frame 50 includes a frame main body 52 and a projected frame portion 54 which projects inward from top portions of the inner surface of the frame main body 52. As shown in FIG. 8B which is a reduced plan view, the frame main body 52 and the projected frame portion 54 are shaped like a square frame and the projected frame portion 54 is connected to the inner surface of the frame main body 52 so as to be shaped like a ring.

The frame main body 52 of the cover frame 50 is formed so as to conform to the outer circumferential step R (i.e., the step portion S of the side wall 14 of the container 10) of the above-described structural body shown in FIG. 7A. The height of the cover frame 50 from the bottom surface of the frame main body 52 to the bottom surface of the projected frame portion 54 is set the same as the height of the outer circumferential step R of the structural body shown in FIG. 7A.

The projection length of the projected frame portion 54 is set the same as the width of the top surface 14a of the side wall 14 of the container 10.

With the above structures, the frame main body 52 of the cover frame 50 fits with the outer circumferential step R of the structural body shown in FIG. 7A. The height of the frame main body 52 of the cover frame 50 is adjusted such that the bottom surface of its projected frame portion 54 is placed on a peripheral portion of the top surface of the glass lid 40.

Preferably, the cover frame 50 may be made of a heat-resistant plastic. For example, a composite material that is a mixture of an epoxy resin and a glass filter may be used as the heat-resistant plastic.

The cover frame 50 is formed by injection-molding a heat-resistant plastic. Heat-resistant plastics are less expensive and lighter than metals and superior in heat resistance and strength.

It is preferable that the cover frame 50 be made of a material that is similar in thermal linear expansion coefficient to the container 10 and the glass lid 40. The thermal linear expansion coefficient of the container 10 made of aluminum oxide is about 8 to 10 ppm/° C., and that of the glass lid 40 is about 7 to 10 ppm/° C.

It is preferable that the above-mentioned composite material that is a mixture of an epoxy resin and a glass filter have a thermal linear expansion coefficient in the above range.

Alternatively, the cover frame 50 may be made of a metal plate such as a copper plate. The cover frame 50 made of a copper plate may be used satisfactorily though its thermal linear expansion coefficient is a little large (16 to 20 ppm/° C.).

As a further alternative, the cover frame 50 may be made of ceramic such as aluminum oxide. In this case, since the cover frame 50 is made of the same material as the container 10, they are identical in thermal linear expansion coefficient.

By setting the thermal linear expansion coefficients of the container 10, the glass lid 40, and the cover frame 50 similar to each other, occurrence of thermal stress due to various kinds of heat treatment in later steps is suppressed, thereby leading to increase in reliability.

The cover frame 50 as described above is prepared, and a second adhesive layer 56 is applied to the outer circumferential step R of the structural body shown in FIG. 8A from the nozzle of a dispenser (not shown).

Then, as shown in FIG. 9, the cover frame 50 is placed on the outer circumferential step R of the structural body shown in FIG. 8A (i.e., the step portion S of the side wall 14 of the container 10) via the second adhesive layer 56. The second adhesive layer 56 can be made of an ultraviolet-setting and thermosetting adhesive material or a thermosetting adhesive material.

Where the second adhesive layer 56 made of an ultraviolet-setting and thermosetting adhesive material is used, it is semi-cured and fixed tentatively illuminating it with ultraviolet light through the cover frame 50. After the cover frame 50 is positioned if necessary, the second adhesive layer 56 is cured completely by heat treatment at about 180° C.

Where the second adhesive layer 56 made of a thermosetting adhesive material is used, it is cured completely only by heat treatment.

As a result, as shown in an inset (partial enlarged view) in FIG. 9, the cover frame 50 is bonded to the horizontal surface S2 and the side surfaces S1 of the step portion S of the side wall 14 of the container 10 and the outer circumferential surfaces 40a and the top peripheral surface 40b of the glass lid 40 with the second adhesive layer 56.

The second adhesive layer 56 is applied with such a volume as to flow so as to cover the entire bonding surfaces of the cover frame 50 and to have a final thickness of 5 to 10 μm, for example.

Since the cover frame 50 and the container 10 are separate bodies, the first adhesive layer 42 and the second adhesive layer 56 can be made of materials that are different from each other in characteristics and are suitable for their purposes.

For example, in bonding the bottom peripheral surface of the glass lid 40 to the container 10, it is preferable to use the first adhesive layer 42 made of an ultraviolet-setting and thermosetting adhesive material to prevent positional deviation of the glass lid 40 due to a phenomenon caused by heating that the adhesive material's flowing out to inside the container 10 or expansion of the air inside the container 10.

In bonding the cover frame 50 to the step portion S of the side wall 14 of the container 10, it is not necessary to give much consideration to flowing-out of the adhesive material and positional deviation of the glass lid 40 unlike in the case of bonding the bottom peripheral surface of the glass lid 40 to the container 10. It is therefore preferable to use a thermosetting adhesive material that can provide higher bonding strength than an ultraviolet-setting and thermosetting adhesive material.

In the embodiment, an ultraviolet-setting and thermosetting adhesive material is used as the first adhesive layer 42 and a thermosetting adhesive material as the second adhesive layer 56. This makes it possible to fix the glass lid 40 strongly without causing flowing-out of the adhesive material to inside the container 10 or positional deviation of the glass lid 40.

A solid-state imaging device 1 according to the first embodiment is manufactured as shown in FIG. 9 by the above-described manufacturing method. FIG. 10 is a reduced plan view, as viewed from above, of the solid-state imaging device 1 shown in FIG. 9. In FIG. 10, the cover frame 50 is drawn by thick lines.

As shown in FIG. 9, the solid-state imaging device 1 according to the first embodiment is equipped with the container 10 which was described above with reference to FIG. 4A. The container 10 includes the bottom plate 12 and the frame-shaped side wall 14 which is provided on the outer circumferential portion of the bottom plate 12. The recess C is formed by the bottom plate 12 and the side wall 14 on the side of the top surface of the container 10.

The first electrodes 20 are formed on the top surface of the bottom plate 12 of the container 10, and the second electrodes 22 are formed on the bottom surface of the bottom plate 12 of the container 10. The through-holes TH penetrate through the bottom plate 12 of the container 10 in its thickness direction and are filled with the respective penetration conductors TC.

The first electrodes 20 are connected to the second electrodes 22 by the penetration conductors TC, respectively.

The solid-state imaging element 30 is mounted on the bottom plate 12 of the container 10. The connection electrodes 32 which are formed on the top surface of the solid-state imaging element 30 are connected to the first electrodes 20 arranged in the container 10 by the metal wires W, respectively.

The solder bumps SB are formed on the respective second electrodes 22 which are arranged on the bottom surface of the bottom plate 12 of the container 10. The solder bumps SB are an example of the external connection terminals.

Referring to the inset (partial enlarged view) in FIG. 9 and FIG. 10 which is a reduced plan view, the ring-shaped continuous step portion S is formed adjacent to the outer circumference of the top surface 14a of the side wall 14 of the container 10. The step portion S is formed by the side surfaces S1 which extend down vertically from the outer circumference of the top surface 14a of the side wall 14 and the horizontal surface S2 which extends outward horizontally from the bottom ends of the side surfaces S1.

That is, the step portion S has the horizontal surface S2 which is located at a lower position than the top surface 14a of the side wall 14 and the side surface S1 which connects the top surface 14a and the horizontal surface S2.

The peripheral portion of the bottom surface of the glass lid 40 is bonded to the top surface 14a of the side wall 14 of the container 10 with the first adhesive layer 42, whereby the solid-state imaging element 30 which is mounted in the container 10 is sealed in airtightly.

As shown in FIG. 10, the glass lid 40 has the same plan-view size as a square having, as its outer circumference, the side surface S1 of the step portion S of the side wall 14 of the container 10.

Thus, the side surface S1 of the step portion S of the side wall 14 of the container 10 and the outer circumferential surface 40a of the glass lid 40 have the same horizontal positions. The side surface S1 of the step portion S of the side wall 14 of the container 10, the side surface 42a of the first adhesive layer 42, and the outer circumferential surface 40a of the glass lid 40 form approximately a flat vertical surface.

As a result, the side surface 42a of the first adhesive layer 42 and the outer circumferential surface 40a of the glass lid 40 are located over the side surface S1 of the step portion S of the side wall 14 of the container 10, whereby the L-shaped outer circumferential step R is formed. The outer circumferential step R functions as a bonding reinforcement region for reinforcing the bonding of the glass lid 40.

The cover frame 50 is bonded to the above outer circumferential step R with the second adhesive layer 56. Additionally, referring to FIG. 10 which is a reduced plan view, in a plan view, the cover frame 50 is formed by the frame main body 52 which is square in a plan view and the square projected frame portion 54 which projects inward from the top portion of the inner surface of the frame main body 52.

As shown in the inset (partial enlarged view) in FIG. 9, the bottom surface 52a of the frame main body 52 of the cover frame 50 is bonded to the horizontal surface S2 of the step portion S of the side wall 14 of the container 10 with the second adhesive layer 56. The inner side surface 52b of the frame main body 52 of the cover frame 50 is bonded to the side surface S1 of the step portion S of the side wall 14 of the container 10, the side surface 42a of the first adhesive layer 42, and the outer circumferential surface 40a of the glass lid 40 with the second adhesive layer 56.

Furthermore, a bottom surface 54a of the projected frame portion 54 of the cover frame 50 is bonded to the top peripheral surface 40b of the glass lid 40 with the second adhesive layer 56.

As described above, the cover frame 50 is placed on the step portion S of the side wall 14 of the container 10 and bonded to the step portion S and the outer circumferential surface 40a of the glass lid 40.

As described above, in the solid-state imaging device 1 according to the embodiment, a first bonding structure is provided in which the peripheral portion of the bottom surface of the glass lid 40 is bonded to the top surface 14a of the side wall 14 of the container 10 with the first adhesive layer 42 such that the step portion S of the side wall 14 is exposed.

A second bonding structure is provided in which the inner side surface 52b of the cover frame 50 is bonded to the outer circumferential surface 40a of the glass lid 40 and the side surface S1 of the step portion S with the second adhesive layer 56. In this manner, the cover frame 50 functions as a joining assisting member for joining the outer circumferential surface 40a of the glass lid 40 and the step portion S of the side wall 14 of the container 10 to each other.

Furthermore, the glass lid 40 is bonded to the side wall 14 of the container 10 with the first adhesive layer 42 so as to be pushed down by the projected frame portion 54 of the cover frame 50.

In this embodiment, the bonding area is secured three-dimensionally, that is, in not only the horizontal direction (width direction) but also the vertical direction (in which the side surface extends) by forming the step portion S in the side wall 14 of the container 10. As a result, a wide bonding area can be secured substantially without increasing the width of the side wall 14 of the container 10.

Since it is not necessary to increase the width of the side wall 14 of the container 10 for the purpose of increasing the bonding strength of the glass lid 40, the restriction relating to the width of the side wall 14 of the container 10 is removed. Thus, the outer size of the container 10 can be reduced, enabling miniaturization of a solid-state imaging device.

Since the outer size of a solid-state imaging device can be reduced, increase in the material cost of each member can be avoided and hence the overall cost can be lowered. Furthermore, since size increase of a solid-state imaging device can be prevented, risk of occurrence of a warp can be lowered.

Furthermore, it is not necessary to use the beads-containing adhesive layer described above as part of the preparatory items to increase the bonding strength of the glass lid.

Thus, even where the width of the side wall 14 of the container 10 is small, paste-like adhesive can be applied stably being supplied from a narrow nozzle of a dispenser, which prevents lowering of the manufacturing efficiency. Non-use of a beads-containing adhesive layer enables cost reduction.

The glass lid 40 is bonded to the top surface 14a of the side wall 14 of the container 10 with the thin-film first adhesive layer 42 which does not contain beads. Since there is no influence from a variation in the diameter of beads, the allowances of the length from the solid-state imaging element 30 to the back surface of the glass lid 40 and the inclination of the glass lid 40 can be reduced.

Figure 11:
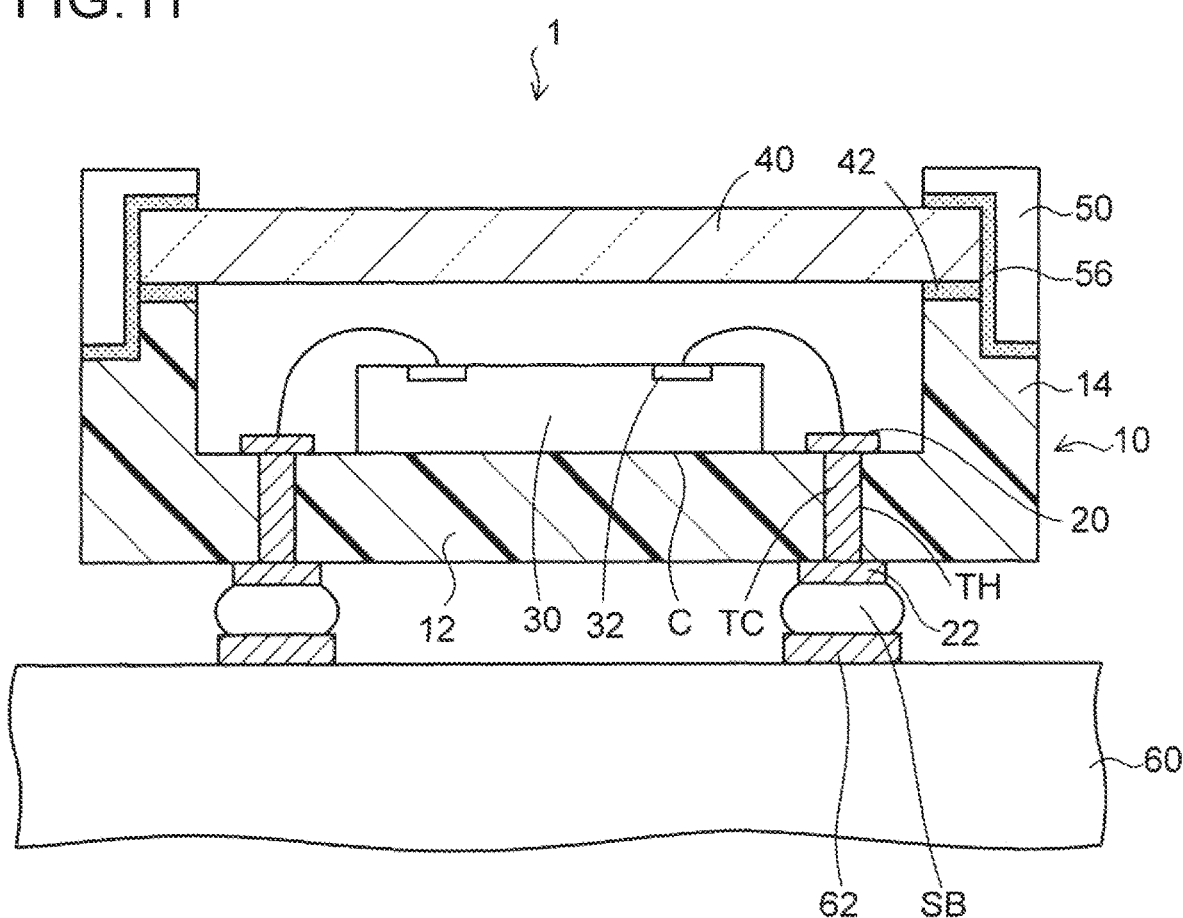
FIG. 11 is a sectional view showing how the solid-state imaging device shown in FIG. 9 is connected to a mounting board.

FIG. 11 shows how the solid-state imaging device 1 shown in FIG. 9 is connected to a mounting board 60 such as a mother board. As shown in FIG. 11, the solder bumps SB of the solid-state imaging device 1 shown in FIG. 9 are placed on solder layers (not shown) formed on connection electrodes 62 of the mounting board 60, respectively. The solder bumps SB of the solid-state imaging device 1 are connected to the connection electrodes 62 of the mounting board 60 by reflow heating. The solder layers are made of lead-free solder such as tin (Sn) solder, silver (Ag) solder, or copper (Cu) solder, and the reflow heating is performed at about 260° C.

The air inside the solid-state imaging device 1 expands during the reflow heating. However, as described above, in the solid-state imaging device 1 according to this embodiment, the glass lid 40 is fixed to the side wall 14 of the container 10 with high bonding strength because of the action of the cover frame 50 which serves as the bonding assisting member. Thus, the glass lid 40 is prevented from peeling off the side wall 14 of the container 10.

(Second Embodiment)

Figure 12A:
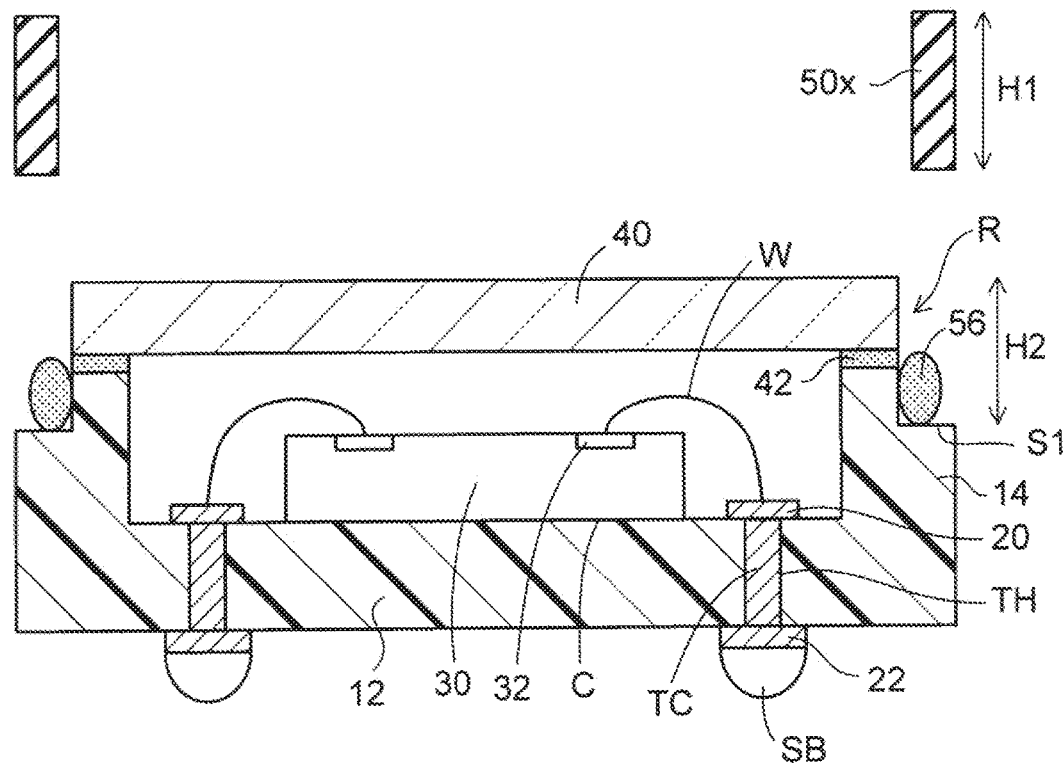
FIG. 12A is a sectional view for description of a manufacturing method of a solid-state imaging device according to a second embodiment of the invention.
Figure 12B:
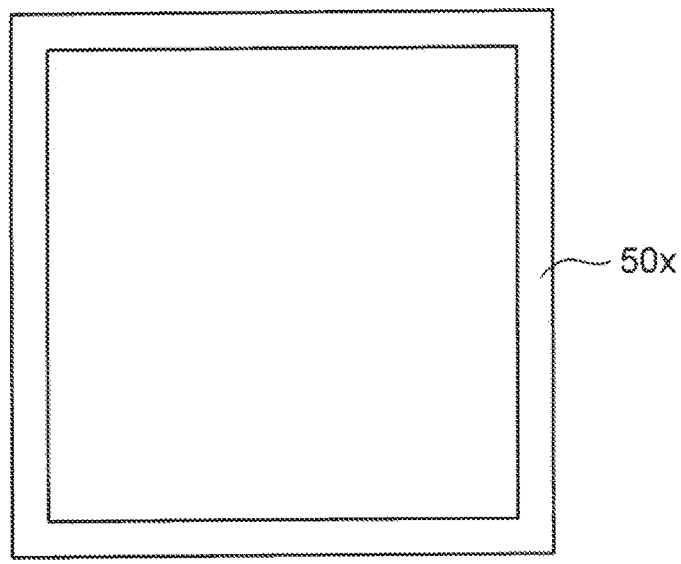
FIG. 12B is a top view for description of the manufacturing method of the solid-state imaging device according to the second embodiment.
Figure 13A:
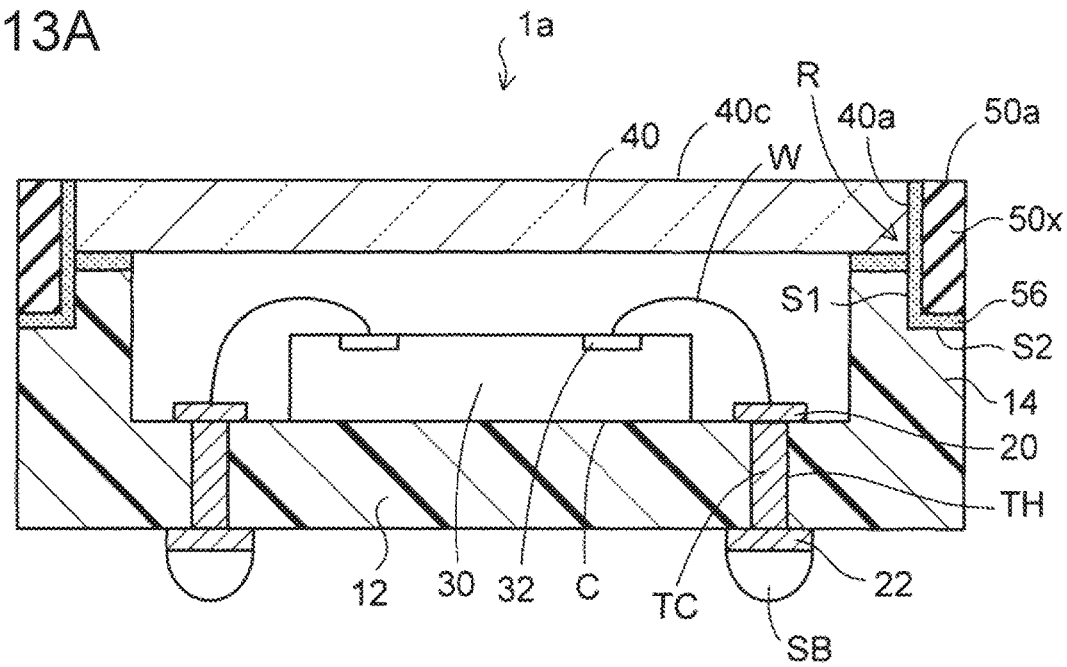
FIG. 13A is a sectional view of the solid-state imaging device according to the second embodiment.
Figure 13B:
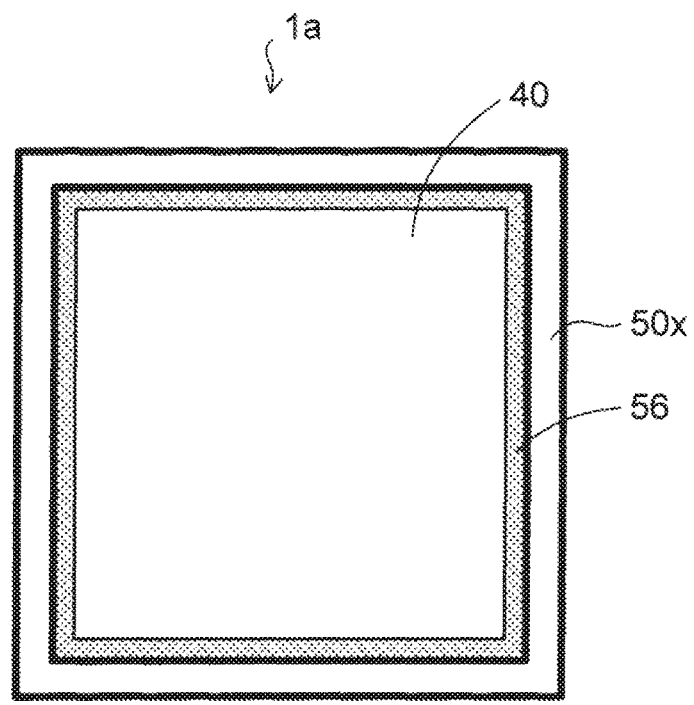
FIG. 13B is a top view of the solid-state imaging device according to the second embodiment

FIG. 12A is a sectional view showing a manufacturing method of a solid-state imaging device according to a second embodiment of the invention. FIG. 12B is a plan view showing the manufacturing method of the solid-state imaging device according to the second embodiment. FIG. 13A is a sectional view showing the solid-state imaging device according to the second embodiment. FIG. 13B is a plan view showing the solid-state imaging device according to the second embodiment.

The second embodiment is different from the first embodiment in the shape of the cover frame. In the second embodiment, elements having the same ones in the first embodiment will be given the same reference symbols as the latter and will not be described in detail.

In the second embodiment, as shown in FIGS. 12A and 12B, a cover member 50x not having a projected frame portion 54 is prepared in a step corresponding to the above-described step shown in FIG. 8A of the first embodiment.

FIG. 12B is a reduced plan view, as viewed from above, of the cover frame 50x shown in FIG. 12A. As shown in FIGS. 12A and 12B, the cover frame 50x consists of only the frame main body 52 of the above-described cover frame 50 shown in FIGS. 8A and 8B.

The height H1 of the cover frame 50x is set the same as the height H2 of the outer circumferential step R (i.e., the height from the horizontal surface S2 of the step portion S of the side wall 14 of the container 10 to the top surface of the glass lid 40).

After the preparation of the cover frame 50x, a second adhesive layer 56 is applied to the outer circumferential step R of the structural body shown in FIG. 12A from the nozzle of a dispenser (not shown).

Then, as shown in FIG. 13A, the cover frame 50x is placed on the outer circumferential step R of the structural body shown in FIG. 12A via a second adhesive layer 56. Subsequently, as in the step shown in FIG. 9, the second adhesive layer 56 is illuminated with ultraviolet light and then subjected to heat treatment, whereby the second adhesive layer 56 is cured completely.

As a result, the cover frame 50x is fitted with the outer circumferential step R and bonded to the outer circumferential step R with the second adhesive layer 56.

A top surface 50a of the cover frame 50x is located at the same height position as a top surface 40c of the glass lid 40.

A solid-state imaging device 1a according to the second embodiment is manufactured as shown in FIGS. 13A and 13B by the above-described manufacturing method. FIG. 13B is a reduced plan view, as viewed from above, of the solid-state imaging device 1a shown in FIG. 13B.

As shown in FIGS. 13A and 13B, the solid-state imaging device 1a according to the second embodiment is different from the solid-state imaging device 1 according to the first embodiment in that the cover frame 50x of the former does not have the projected frame portion 54 of the cover frame 50. The top surface 50a of the cover frame 50x and the top surface 40c of the glass lid 40 are at the same height, that is, are flush with each other. As a result, the whole top surface 40c of the glass lid 40 are exposed from the cover frame 50x. In FIG. 13B which is a reduced plan view, the cover frame 50x is drawn by thick lines.

The solid-state imaging device 1a according to the second embodiment is configured such that the cover frame 50x does not stick out upward from the top surface 40c of the glass lid 40. Thus, the overall thickness of the solid-state imaging device 1a can be made as thin as possible.

The cover frame 50x is bonded to the outer circumferential step R with the second adhesive layer 56. The bottom surface of the cover frame 50x is bonded to the horizontal surface S2 of the step portion S of the side wall 14 of the container 10 with the second adhesive layer 56. The inner side surface of the cover frame 50x is bonded to the side surface S1 of the step portion S of the side wall 14 of the container 10 and the outer circumferential surface 40a of the glass lid 40 with the second adhesive layer 56.

As shown in FIG. 13B which is a reduced plan view, when viewed from the top, the second adhesive layer 56 is exposed in a square frame shape between the outer circumference of the glass lid 40 and the inner circumference of the cover frame 50x.

As such, as in the first embodiment, the cover frame 50x functions as a joining assisting member for joining the outer circumferential surface 40a of the glass lid 40 and the step portion S of the side wall 14 of the container 10 to each other, whereby the glass lid 40 and the side wall 14 of the container 10 are fixed to each other with high bonding strength.

Thus, the bonding area can be increased substantially without increasing the width of the side wall 14, whereby the bonding strength of the glass lid 40 can be increased.

The solid-state imaging device 1a according to the second embodiment can not only provide the same advantages as the solid-state imaging device 1 according to the first embodiment but also be made thinner.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing an imaging device, the method comprising:
preparing a container comprising: a bottom plate, a side wall provided an outer circumferential portion of the bottom plate; and a step portion which is formed in a top outer circumferential portion of the side wall and comprises a horizontal surface that is located at a lower position than a top surface of the side wall and a side surface that connects the top surface of the side wall to the horizontal surface;
mounting an imaging element on the bottom plate;
bonding a glass lid to the top surface of the side wall with a first adhesive layer; and
disposing a cover frame on the step portion such that the cover frame is bonded to the side surface of the step portion and an outer circumferential surface of the glass lid with a second adhesive layer.

2) The method according to clause (1), wherein
the step of bonding the glass lid comprises:
disposing the glass lid on the top surface of the side wall with the first adhesive layer; and
curing the first adhesive layer.

3) The method according to clause (2), wherein
the step of curing the first adhesive layer comprises:
fixing the glass lid to the side wall tentatively by semi curing the first adhesive layer by illuminating the first adhesive layer with ultraviolet light;
positioning the glass lid; and
curing the first adhesive layer by heat treatment.

What is claimed is:

1. An imaging device comprising:
   a container comprising a bottom plate and a side wall provided on an outer circumferential portion of the bottom plate;
   a step portion which is formed in a top outer circumferential side surface of the side wall and comprises: a horizontal surface that is located at a lower position than a top surface of the side wall; and a side surface that connects the top surface of the side wall to the horizontal surface;
   an imaging element mounted on the bottom plate;
   a glass lid which is bonded to the top surface of the side wall with a first adhesive layer; and
   a cover frame which is disposed on the step portion and bonded to the side surface of the step portion and directly to an outer circumferential surface of the glass lid with a second adhesive layer, the cover frame having a square frame shape with a central opening defined therein.

2. The imaging device according to claim 1, wherein the second adhesive layer is made of a material that is different in characteristics from a material of the first adhesive layer.

3. The imaging device according to claim 2, wherein the first adhesive layer is made of an adhesive material that is cured or semi-cured by illumination with ultraviolet light.

4. The imaging device according to claim 3, wherein the second adhesive layer is made of a thermosetting adhesive material.

5. The imaging device according to claim 1, wherein
the cover frame comprises:
a frame main body; and
a projected frame portion which projects from an inner surface of the frame main body, wherein the projected frame portion is bonded to the glass lid and an inner edge of the projected frame portion defines the central opening.

6. The imaging device according to claim 1, wherein a top surface of the cover frame is flush with a top surface of the glass lid.

7. The imaging device according to claim 1, wherein the cover frame is made of a heat-resistant plastic, a metal, or ceramic.

8. The imaging device according to claim 1, wherein the container is made of ceramic.

9. The imaging device according to claim 1, wherein at least a portion of the glass lid and the imaging element are exposed through the central opening of the cover frame.

\* \* \* \* \*